(12) United States Patent
Mugibayashi et al.

(10) Patent No.: US 6,769,111 B2
(45) Date of Patent: Jul. 27, 2004

(54) COMPUTER-IMPLEMENTED METHOD OF PROCESS ANALYSIS

(75) Inventors: Toshiaki Mugibayashi, Tokyo (JP); Nobuyoshi Hattori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/216,844

(22) Filed: Aug. 13, 2002

(65) Prior Publication Data

US 2003/0065411 A1 Apr. 3, 2003

(30) Foreign Application Priority Data

Sep. 25, 2001 (JP) ..................................... P2001-291475

(51) Int. Cl.⁷ ............................................... G06F 17/50

(52) U.S. Cl. .............................. 716/19; 716/20; 716/21

(58) Field of Search .............. 716/19–21; 700/109–110; 714/38; 702/117–119

(56) References Cited

U.S. PATENT DOCUMENTS

| | | | | |
|---|---|---|---|---|
| 4,885,712 A | * | 12/1989 | Yamane | 702/117 |
| 6,070,131 A | * | 5/2000 | Damon et al. | 702/122 |
| 6,256,593 B1 | * | 7/2001 | Damon et al. | 702/84 |
| 6,341,241 B1 | * | 1/2002 | Mugibayashi et al. | 700/110 |
| 6,456,951 B1 | * | 9/2002 | Maeda et al. | 702/81 |
| 6,473,665 B2 | * | 10/2002 | Mugibayashi et al. | 700/110 |
| 6,601,192 B1 | * | 7/2003 | Bowman-Amuah | 714/38 |
| 2002/0095645 A1 | * | 7/2002 | Rodeh | 716/4 |

OTHER PUBLICATIONS

Pak, J. et al., "Advanced methods for analysis of wafer-to-wafer yield variation", Advanced Semiconductor Manufacturing Conference and Workshop, IEEE /SEMI, Sep. 10–12, 1997, pp 62–66.*

Lee, F.;"Advanced yield enhancement: integrated yield analysis", Advanced Semiconductor Manufacturing Conference and Workshop, 1997. IEEE /SEMI , Sep. 10–12, 1997 pp.: 67–75.*

Rajkanan, K.; "Yield analysis methodology for low defectivity wafer fabs", Memory Technology, Design and Testing, 2000. Records of the 2000 IEEE International Workshop on , Aug. 7–8, 2000 pp.: 65–69.*

Ott, R.et al., "An effective method to estimate defect limited yield impact on memory devices", Advanced Semiconductor Manufacturing Conference and Workshop, IEEE/SEMI , Sep. 8–10, 1999. pp.: 87–91.*

Toshiaki Mugibayashi, et al., "A Novel Quantitative Analysis of Defects Detected by In–Line Monitoring", ISSM 98, 1998, pp. 335–338.

* cited by examiner

*Primary Examiner*—Vuthe Siek
*Assistant Examiner*—Naum Levin
(74) *Attorney, Agent, or Firm*—Oblon, Spivak, McClelland, Maier & Neustadt, P.C.

(57) ABSTRACT

A computer-implemented method of process analysis allows for accurate analysis of the degree of achievement of a predetermined effect exhibited by a predetermined process included in a manufacturing operation. In a step S2, a first manufacturing operation including a predetermined cleaning process is performed to form chips on wafers to be cleaned. In a step S3, a second manufacturing operation including details identical to those of the first manufacturing operation except the predetermined cleaning process is performed to form chips on wafers not to be cleaned. In a step S4, an electric tester is applied to all the chips formed on the wafers to be cleaned and the wafers not to be cleaned, to determine the quality of each chip. In a step S5, all the chips are classified into four categories according to the kind of wafer (i.e., the wafer to be cleaned or the wafer not to be cleaned) and the quality as determined of each chip. Then, in a step S6, the effect of improving the quality of a chip achieved by the predetermined cleaning process is analyzed using the classification performed in the step S5 as "chip classification data".

12 Claims, 7 Drawing Sheets

F I G . 1
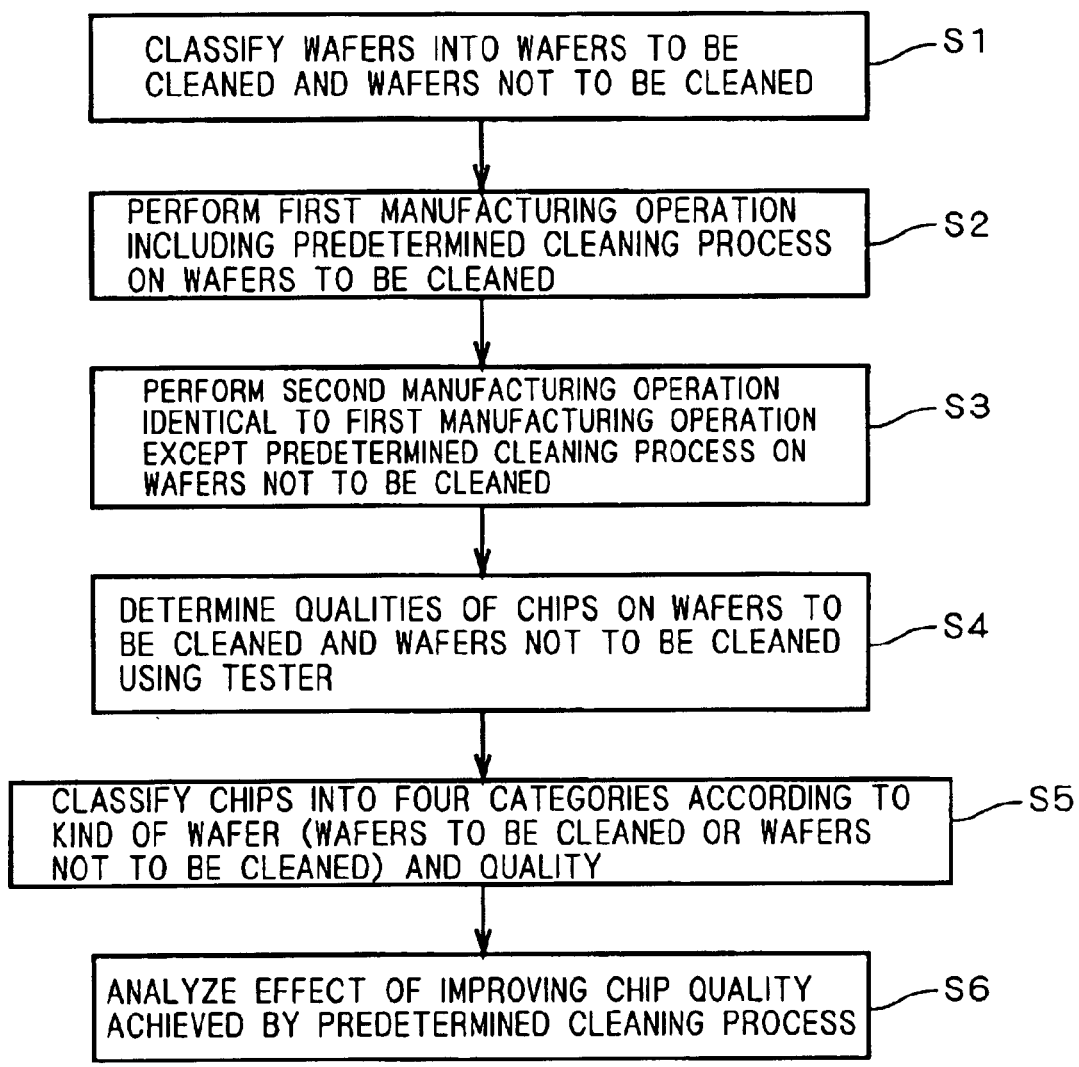

|  | CLEANING PROCESS | | |
|---|---|---|---|
|  |  | UN-CLEANED | CLEANED | SUBTOTAL |
| TEST RESULT | DEFECTIVE | ① 29(N1) | ③ 16(N3) | 45 |
|  | ACCEPTABLE | ② 106(N2) | ④ 254(N4) | 360 |
|  | SUBTOTAL | 135 | 270 | 405 |

F I G . 6
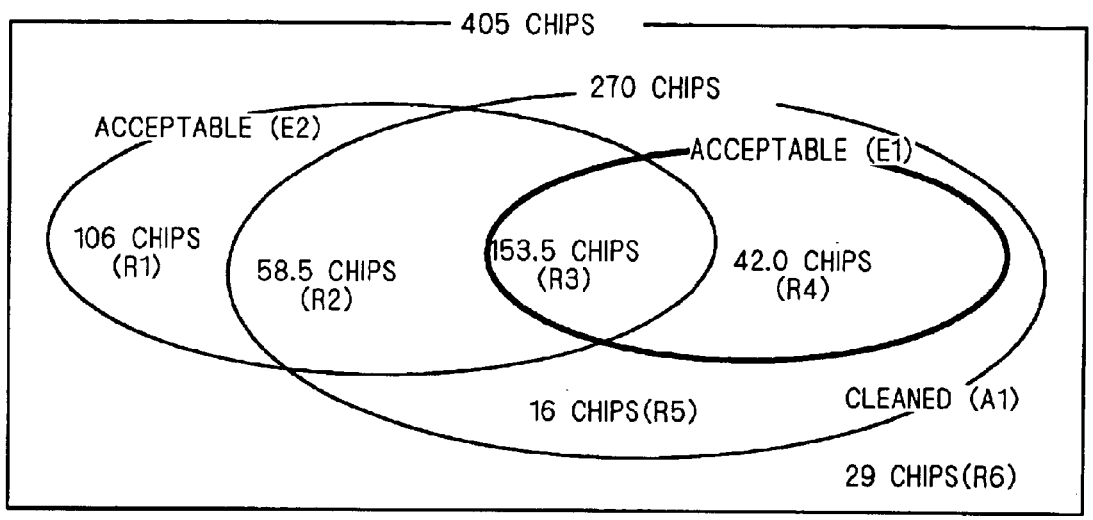
F I G . 7
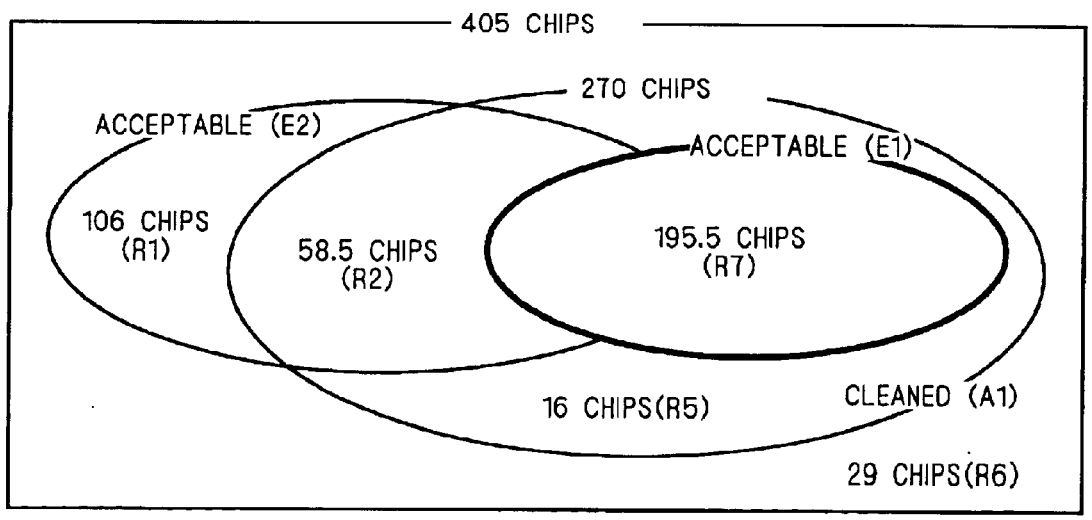

F I G . 8
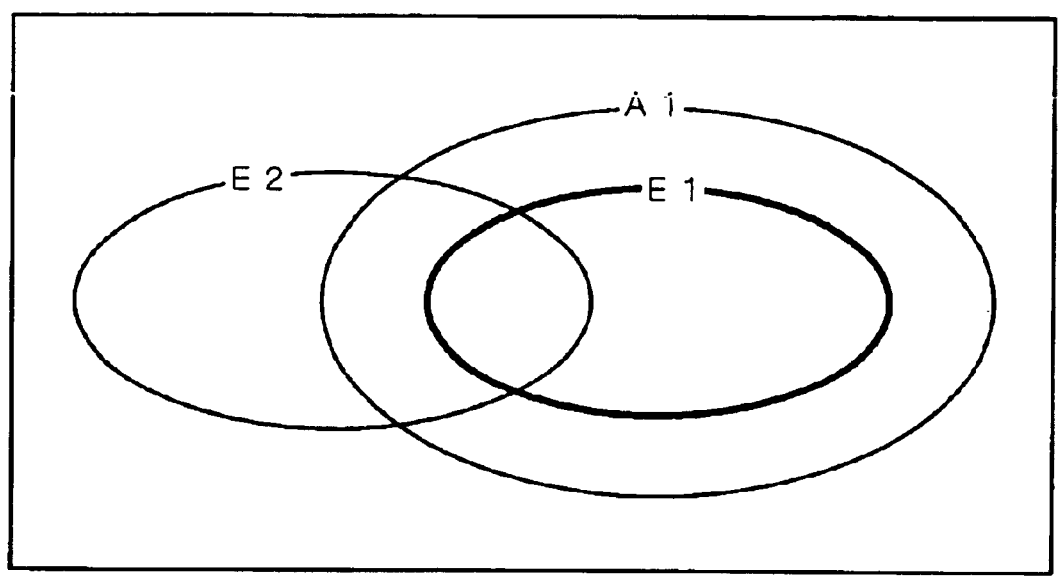

FIG. 9

| PREDETERMINED PROCESS | DIFFERENCE IN DETAILS | PREDETERMINED EFFECT | NUMBER OF PRODUCTS WITH PREDETERMINED EFFECT |
|---|---|---|---|
| (SEMICONDUCTOR) CLEANING PROCESS | PRESENCE OR ABSENCE OF SEMICONDUCTOR CLEANING PROCESS | IMPROVEMENT IN PRODUCT QUALITY BY CLEANING | NUMBER OF ACCEPTABLE CHIPS |
| PHOTOLITHOGRAPHY PROCESS | CONDITIONS FOR PHOTOLITHOGRAPHY | IMPROVEMENT IN PRODUCT QUALITY BY CHANGE IN CONDITIONS FOR PHOTOLITHOGRAPHY | NUMBER OF ACCEPTABLE CHIPS |
| ION IMPLANTATION PROCESS | AMOUNT OF ION IMPLANTATION | IMPROVEMENT IN PRODUCT QUALITY BY CHANGE IN AMOUNT OF ION IMPLANTATION | NUMBER OF ACCEPTABLE CHIPS |
| ETCHING PROCESS | ETCHING CONDITIONS | IMPROVEMENT IN PRODUCT QUALITY BY CHANGE IN ETCHING CONDITIONS | NUMBER OF ACCEPTABLE CHIPS |
| CMP PROCESS | CONDITIONS FOR CMP | IMPROVEMENT IN PRODUCT QUALITY BY CHANGE IN CONDITIONS FOR CMP | NUMBER OF ACCEPTABLE CHIPS |
| ATMOSPHERE CONTROL PROCESS (FOR AVOIDING CONTACT WITH CONTAMINANTS DURING PROCESS, TRANSPORTATION AND PRESERVATION) | PRESENCE OR ABSENCE OF ATMOSPHERE CONTROL PROCESS | IMPROVEMENT IN PRODUCT QUALITY BY ATMOSPHERE CONTROL | NUMBER OF ACCEPTABLE PRODUCTS |
| HEATING PROCESS (UNDER STANDARD CONDITIONS) | PRESENCE OR ABSENCE OF HEATING PROCESS | IMPROVEMENT IN PRODUCT QUALITY BY HEATING | NUMBER OF ACCEPTABLE PRODUCTS |
| COOLING PROCESS (UNDER STANDARD CONDITIONS) | PRESENCE OR ABSENCE OF COOLING PROCESS | IMPROVEMENT IN PRODUCT QUALITY BY COOLING | NUMBER OF ACCEPTABLE PRODUCTS |
| PRESSURIZING PROCESS (UNDER STANDARD CONDITIONS) | PRESENCE OR ABSENCE OF PRESSURIZING PROCESS | IMPROVEMENT IN PRODUCT QUALITY BY PRESSURIZING | NUMBER OF ACCEPTABLE PRODUCTS |
| PRESSURE-REDUCING PROCESS (UNDER STANDARD CONDITIONS) | PRESENCE OR ABSENCE OF PRESSURE-REDUCING PROCESS | IMPROVEMENT IN PRODUCT QUALITY BY PRESSURE REDUCTION | NUMBER OF ACCEPTABLE PRODUCTS |
| ADDITION OF MATERIAL | PRESENCE OR ABSENCE OF MATERIAL ADDITION | IMPROVEMENT IN PRODUCT QUALITY BY MATERIAL ADDITION | NUMBER OF ACCEPTABLE PRODUCTS |
| ENTIRE PATTERNING PROCESS (UNDER STANDARD CONDITION) | DESIGN CONDITIONS (LINE WIDTH, LAYOUT, REDUNDANT CIRCUIT DEVICE) | IMPROVEMENT IN PRODUCT QUALITY ACCORDING TO DESIGN CONDITIONS | NUMBER OF ACCEPTABLE CHIPS |

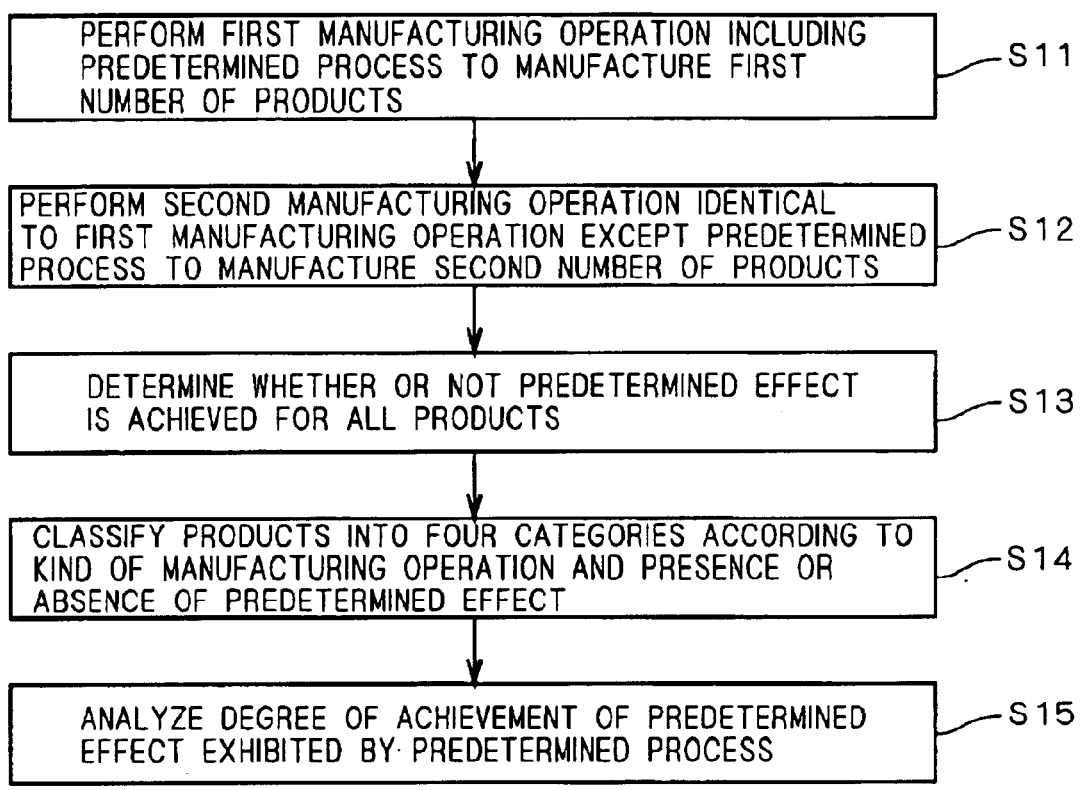

COMPUTER-IMPLEMENTED METHOD OF PROCESS ANALYSIS

BACKGROUND OF THE INVENTION

1. Field of the Invention

The present invention relates to a computer-implemented method of process analysis for analyzing the degree of achievement of a predetermined effect exhibited by one predetermined process included in an entire manufacturing operation.

2. Description of the Background Art

In general, products such as semiconductor devices including a DRAM, a microcomputer and the like are manufactured through a manufacturing operation including a plurality of processes. Conventionally, in order to find product yield of such products, an overall electrical characteristic quality test has been performed on each of the products as completed after the manufacturing operation.

To simply find product yield in the conventional manner as noted above, however, could hardly allow for accurate analysis of the degree of achievement of a predetermined effect, which is represented by the quality of each product, for example, exhibited by one predetermined process in the manufacturing operation including a plurality of processes.

SUMMARY OF THE INVENTION

It is therefore an object of the present invention to provide a computer-implemented method of process analysis which makes it possible to accurately analyze the degree of achievement of a predetermined effect exhibited by one predetermined process included in an entire manufacturing operation including a plurality of processes.

According to the present invention, a computer-implemented method of process analysis includes the following steps (a) to (e). The step (a) is to perform a first manufacturing operation including a predetermined process to obtain a first number of products. The step (b) is to perform a second manufacturing operation differing from the first manufacturing operation only in details associated with the predetermined process to obtain a second number of products of the same kind as those obtained by the step (a). The step (c) is to determine whether or not a predetermined effect is achieved with respect to each of the products obtained by the steps (a) and (b). The step (d) is to classify the products obtained by the steps (a) and (b) into four categories depending on which of the first manufacturing operation and the second manufacturing operation has been performed, and on whether or not the predetermined effect has been achieved. The step (e) is to analyze a degree of achievement of the predetermined effect exhibited by the predetermined process based on classification of the step (d), to provide an analysis result.

The classification of the products into four categories depending on which of the first and second manufacturing operations has been performed and whether or not the predetermined effect has been achieved can be used as classification data. By using the classification data, it is possible to obtain an accurate result of analyzing the degree of achievement of the predetermined effect which takes into consideration difference between the first manufacturing operation including the predetermined process and the second manufacturing operation differing from the first manufacturing operation only in details associated with the predetermined process.

This and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flow chart illustrating a method of analyzing a cleaning process according to a preferred embodiment of the present invention.

FIGS. 6 and 7 are Venn diagrams showing results of analysis of all the 405 chips classified as shown in FIG. 2.

FIG. 8 is a Venn diagram showing a result of analyzing the degree of achievement of a predetermined effect exhibited by a predetermined process.

FIG. 9 is a table showing examples of processes each as the predetermined process.

FIG. 10 is a flow chart illustrating a process analysis method of analyzing the degree of achievement of effect exhibited by a predetermined process in a predetermined manufacturing operation which is applicable to the present invention.

DESCRIPTION OF THE PREFERRED EMBODIMENTS

Preferred Embodiment

[Process Flow]

FIG. 1 is a flow chart illustrating a method of analyzing a cleaning process according to a preferred embodiment of the present invention. More specifically, the flow chart of FIG. 1 illustrates a method of analyzing an effect of improving the quality of a chip which is achieved by a cleaning process out of a plurality of processes in an entire manufacturing operation for a semiconductor device. Below, a procedure for the method of analyzing a cleaning process according to the present embodiment will be described with reference to FIG. 1.

First, in a step S1, a predetermined number of wafers on each of which a plurality of chips are to be formed are classified into two groups of a group of wafers to be cleaned and a group of wafers not to be cleaned.

Subsequently, in a step S2, a first manufacturing process including a predetermined cleaning process is performed on the wafers to be cleaned, to form chips (semiconductor devices) on the wafers to be cleaned.

In a step S3, a second manufacturing process containing details identical to those of the first manufacturing process except the predetermined cleaning process is performed on the wafers not to be cleaned, to form chips on the wafers not to be cleaned.

In a step S4, an electric tester is applied to all the chips formed on the wafers to be cleaned and the wafers not to be cleaned, to determine the respective qualities of the chips.

Then, in a step S5, all the chips are classified into four categories according to the kind of wafer (i.e., a wafer to be cleaned or a wafer not to be cleaned) and the quality as determined.

Figures 2, 3:
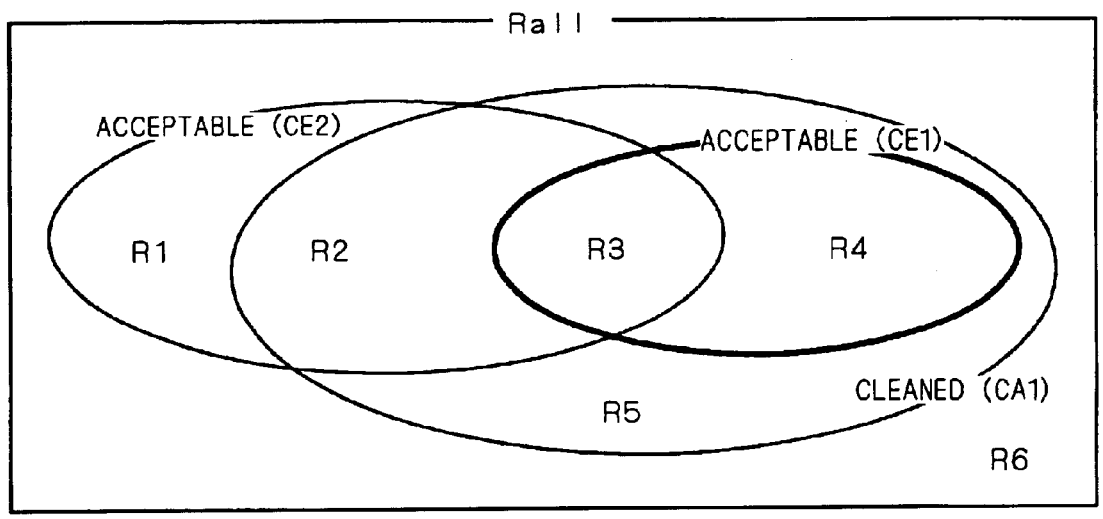
FIG. 2 is a table illustrating classification for analysis.
FIG. 3 illustrates analysis performed according to the preferred embodiment of the present invention.

FIG. 2 shows one example of the classification performed in the step S5 in a form of a table. In the table of FIG. 2, 270 (135×2) chips included in two wafers which are to be cleaned and 135 chips included in one wafer which is not to be cleaned are classified into four categories according to the kind of wafer and the quality as determined, in other words, the chips are classified depending on whether or not each chip has been cleaned (cleaned or un-cleaned) and whether the chip quality is good or bad (acceptable or defective).

Referring to the table of FIG. 2, a box (①) indicates "29" which is a number N1 of un-cleaned defective chips on the wafer not to be cleaned. A box (②) indicates "106" which is a number N2 of un-cleaned acceptable chips on the wafer not to be cleaned. A box (③) indicates "16" which is a number N3 of cleaned defective chips on either of the wafers to be cleaned. Then, a box (④) indicates "254" which is a number N4 of cleaned acceptable chips on either of the wafers to be cleaned.

Referring again to FIG. 1, in a step S6, the effect of improving the quality of a chip achieved by the predetermined cleaning process is analyzed using the classification of the chips into the four categories performed in the step S5 as "chip classification data".

[Details of Analysis]

FIG. 3 illustrates analysis performed in the step S6. More specifically, FIG. 3 is a Venn diagram used for the analysis, which shows: a cleaned chip set CA1 including a chip(s) on which the predetermined cleaning process has been performed; an improved-by-cleaning chip set CE1 including a chip(s), the quality of which is assumed to have been improved by the predetermined cleaning process; and an improved-not-by-cleaning chip set CE2 including a chip(s), the quality of which is assumed to have been improved by a process other than the predetermined cleaning process (however, the chip may have been affected also by the predetermined cleaning process to be improved).

As illustrated in FIG. 3, an entire region Rall directed to all the chips indicated in FIG. 2 (405 chips in total) contains the cleaned chip set CA1 which contains the improved-by-cleaning chip set CE1. The region Rall further contains the improved-not-by-cleaning chip set CE2 such that the set CA1 and the set CE2, as well as the set CE1 and the set CE2, partly overlaps each other.

Further, there are four acceptable product regions R1 to R4 and two defective product regions R5 and R6. The acceptable product region R1 (confirmed) includes an acceptable chip(s) which has not undergone the predetermined cleaning process. The acceptable product region R2 (assumed) includes an acceptable chip(s) which has undergone the predetermined cleaning process and a process other than the predetermined cleaning process, and has been improved (i.e., become acceptable) by only the process other than the predetermined cleaning process. The acceptable product region R3 (assumed) includes an acceptable chip(s) which has undergone the predetermined cleaning process and a process other than the predetermined cleaning process, and has been improved by both the predetermined cleaning process and the other process. The acceptable product region R4 (assumed) includes an acceptable chip(s) which has been improved by only the predetermined cleaning process. The defective product region R5 (confirmed) includes a chip(s) which has undergone the predetermined cleaning process, but has been defective. The defective product region R6 (confirmed) includes a chip(s) which has not undergone the predetermined cleaning process and has been defective.

Accordingly, the number N1 of un-cleaned defective chips corresponds to the number of chips included in the defective product region R6. The number N2 of un-cleaned acceptable chips corresponds to the number of chips included in the acceptable product region R1. The number N3 of cleaned defective chips corresponds to the number of chips included in the defective product region R5. The number N4 of cleaned acceptable chips corresponds to the total number of chips included in the acceptable product regions R2 to R4.

Figure 4:
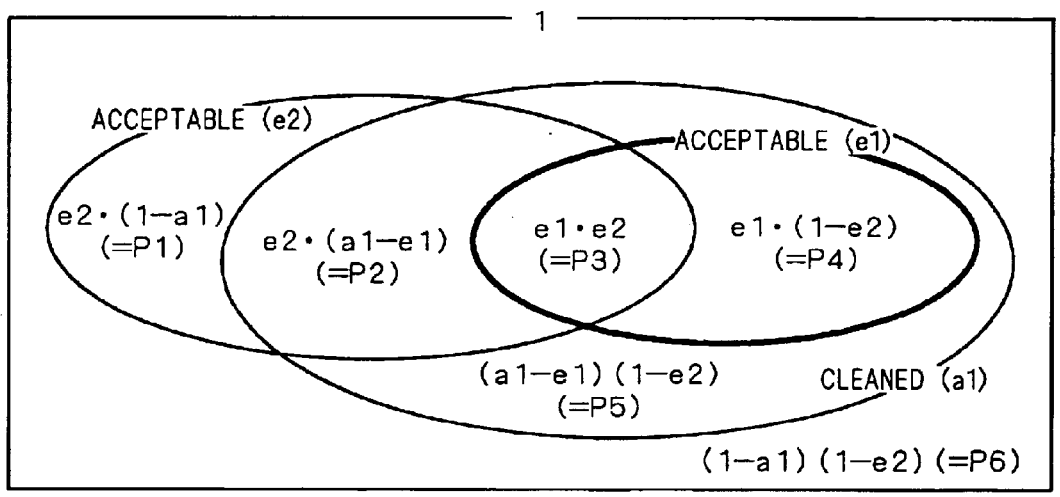
FIG. 4 shows a distribution of respective probabilities of regions shown in a Venn diagram of FIG. 3.

FIG. 4 shows a distribution of respective probabilities of the regions R1 to R6 shown in the Venn diagram of FIG. 3. In FIG. 4, "a1" indicates a probability of the cleaned chip set CA1 in the entire region Rall (i.e., the ratio of the CA1 to the Rall), which will be hereinafter referred to as a "cleaning probability a1". On the other hand, "e1" indicates a probability of the improved-by-cleaning chip set CE1, which will be hereinafter referred to as an "cleaned acceptable chip probability e1"), while "e2" indicates a probability of the improved-not-by-cleaning chip set CE2, which will be hereinafter referred to as a "cleaning-unaffecting acceptable chip probability e2"). Based on the foregoing definitions and assuming that the respective probabilities a1, e1 and e2 are independent of one another, FIG. 4 shows the respective probabilities of the regions R1 to R6 as partial probabilities P1 to P6.

Now, respective probabilities (ratios to the entirety) P(①), P(②), P(③) and P(④) of the four categories shown in FIG. 2 will be expressed by the following equations (1) to (4). It is noted that "Nall" in the following equations (1) to (4) indicates the total number of chips (Nall=N1+N2+N3+N4).

[Equation 1]
$$P(①) = \frac{N1}{Nall} = (1-a1)(1-e2) \quad (1)$$

[Equation 2]
$$P(②) = \frac{N2}{Nall} = e2(1-a1) \quad (2)$$

[Equation 3]
$$P(③) = \frac{N3}{Nall} = (a1-e1)(1-e2) \quad (3)$$

[Equation 4]
$$P(④) = \frac{N4}{Nall} = e1 + e2(a1-e1) \quad (4)$$

From the above equations (1) to (4), the cleaned acceptable chip probability e1, the cleaning-unaffecting acceptable chip probability e2 and the cleaning probability a1 can be derived so as to be expressed by equations composed of the numbers N1 to N4. First, by adding the equations (3) and (4) to each other, an equation (5) which expresses the cleaning probability a1 will be derived as follows.

[Equation 5]
$$a1 = P(③) + P(④) = \frac{(N3+N4)}{Nall} \quad (5)$$

Next, a cleaning effectiveness (rate) e1/a1 which indicates how the predetermined cleaning process contributes to the improvement of a chip quality will be expressed by the following equation (6).

[Equation 6]

$$\frac{e1}{a1} = 1 - \frac{P(③)}{P(③) + P(④)} \times \frac{P(①)}{P(①) + P(②)} \qquad (6)$$

$$= 1 - \frac{N3}{N3 + N4} \times \frac{N1 + N2}{N1}$$

Then, by using the equations (5) and (6), the cleaned acceptable chip probability e1 will be expressed by the following equation (7).

[Equation 7]

$$e1 = \left(1 - \frac{N3}{N3 + N4} \times \frac{N1 + N2}{N1}\right) \times \frac{N3 + N4}{Nall} \qquad (7)$$

Also, by using the equations (2) and (5), the cleaning-unaffecting acceptable chip probability e2 will be expressed by the following equation (8).

[Equation 8]

$$e2 = \frac{P(②)}{1 - a1} = \frac{N2}{N1 + N2} \qquad (8)$$

Figure 5:
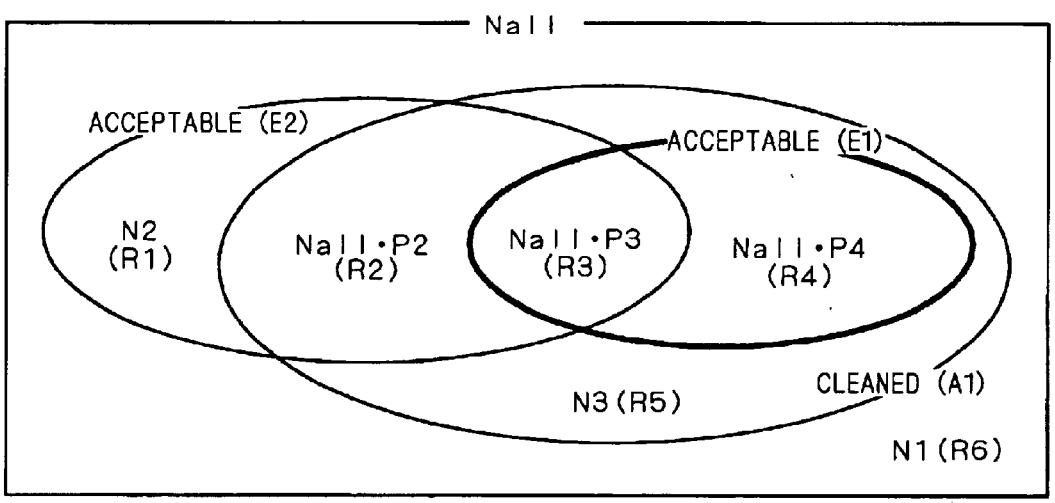
FIG. 5 is a Venn diagram showing a numerical distribution of chips included in an entire region shown in FIG. 3, using partial probabilities.

FIG. 5 is a Venn diagram showing a numerical distribution of the chips included in the entire region Rall of FIG. 3, using the partial probabilities P2, P3 and P4.

Referring to FIG. 5, the respective numbers of chips included in the acceptable product region R1 and the defective product regions R5 and R6 are definite, which correspond to the number N2 of un-cleaned acceptable chips, the number N3 of cleaned defective chips and the number N4 of cleaned acceptable chips, respectively. On the other hand, the numbers of chips in the acceptable product regions R2 to R4 can be estimated as Nall·P2, Nall·P3, and Nall·P4, respectively.

As the partial probabilities P2 to P4 can be expressed with the numbers N1 to N4 by utilizing the above equations (5), (7) and (8), the numerical distribution of chips in the acceptable product regions R2 to R4 can be obtained accordingly.

FIG. 6 is a Venn diagram showing a result of the analysis of all the 405 chips classified as shown in FIG. 2. As shown in FIG. 6, the respective chip numbers in the acceptable product regions R2 to R4 (58.5, 153.5 and 42.0) which have not been unknown before the analysis can be obtained.

As a result of the foregoing procedure, the degree of improvement in the chip quality brought by the predetermined cleaning process will be analyzed as follows.

First, the cleaning effectiveness e1/a1 (=72.4%) which is assumed to be a probability that the predetermined cleaning process will improve the quality of a chip is obtained by using the equation (6). The cleaning effectiveness e1/a1 as obtained allows for quantitative identification of the effectiveness of the predetermined cleaning process in improving the chip quality.

Further, it is possible to obtain a number (an effectiveness increasing number) CU that is the number of acceptable chips which have been improved by only the predetermined cleaning process (=42.0 chips, equal to the number N4 of improved-by-cleaning chips in the product region R4). The number CU numerically clarifies the effectiveness of the predetermined cleaning process in improving the chip quality, which is to be compared with the total number of chips which have undergone the predetermined cleaning process.

As such, the cleaning effectiveness e1/a1 allows for estimation of a probability that the predetermined cleaning process will improve the quality of a chip (or that the predetermined cleaning process will make a chip acceptable), while the number CU allows for estimation of the increase in the number of acceptable chips which have been improved by the predetermined cleaning process. In the present embodiment, it is observed that the predetermined cleaning process performed on 270 chips increases the number of acceptable chips by 42.

Thus, in accordance with the present embodiment, it is possible to accurately analyze the degree of improvement of chip quality brought by application of the predetermined cleaning process in an entire manufacturing operation including a plurality of processes. Even if the number of chips to be cleaned is different from the number of chips not to be cleaned, analysis with sufficient accuracy can be accomplished.

FIG. 7 is a Venn diagram showing a result of the analysis of all the 405 chips classified as shown in FIG. 2 in a different manner from FIG. 6. In FIG. 7, the acceptable product regions R3 and R4 are combined into one acceptable product region R7 (corresponding to the improved-by-cleaning chip set CE1) for identification of the cleaning effectiveness, which is highlighted in the figure.

The showing of FIG. 7 facilitates to visually identify the number of the improved-by-cleaning chip set CE1.

Additionally, it may be possible to have a computer execute an analysis program for performing the processes shown in FIGS. 3 to 6 and expressed by the equations (1) to (8) while using the chip classification data shown in FIG. 2 as inputs, so that the result of the analysis as shown in FIG. 6 or 7 is automatically displayed. This allows for reduction in labor required for the analysis.

Moreover, by varying the respective sizes of the regions R1 to R7 according to the respective chip numbers, it is possible to visually identify difference in size between the improved-by-cleaning chip set CE1 (the cleaning effectiveness e1/a1), the number CU, and the like.

<Generalization in a Manufacturing Operation>

While the preferred embodiment discusses the method of analyzing the degree of improvement of the quality of a chip (semiconductor device) brought by the predetermined cleaning process as a semiconductor manufacturing process, the concept used therein can be adapted into a process analysis method of analyzing the degree of achievement of a predetermined effect exhibited by one predetermined process performed in a case where a product (corresponding to a chip, i.e., a semiconductor device, in the preferred embodiment) is manufactured by a plurality of processes.

FIG. 8 is a Venn diagram showing a result of analyzing the degree of achievement of a predetermined effect exhibited by a predetermined process. The Venn diagram of FIG. 8, similarly to the Venn diagram included in the preferred embodiment, shows: a processed product set A1 including a chip(s) which has undergone the predetermined process (corresponding to the cleaned chip set CA1 in the preferred embodiment); an improved-by-process product set E1 including a chip(s), the quality of which is assumed to have been improved by the predetermined process (corresponding to the improved-by-cleaning chip set CE1 in the preferred embodiment); and an improved-not-by-process product chip set E2 including a chip(s), the quality of which is assumed to have been improved by a process other than the predetermined process (corresponding to the improved-not-by-cleaning chip set CE2 in the preferred embodiment).

FIG. 9 is a table showing examples of processes each as the predetermined process. As shown therein, the predetermined process may be any one of a photolithography process, an ion implantation process, an etching process, a CMP process, an atmosphere control process, a heating process, a cooling process, a pressurizing process, a pressure-reducing process, addition of material such as chemicals, an entire patterning process and the like, as well as the (semiconductor) cleaning process described in the preferred embodiment.

In some cases where any of the cleaning process, the atmosphere control process, the heating process, the cooling process, the pressurizing process, the pressure-reducing process and the material adding process is specified as the predetermined process, a difference in details associated with the predetermined process (which is provided to an entire operation in order to analyze the predetermined process, and thus can be a cause of the predetermined effect) is presence or absence of the predetermined process. In other words, whether or not the process is performed will substantially affect the degree of achievement of the predetermined effect. On the other hand, in other cases, a difference in details associated with the predetermined effect is provided by change in specific conditions in each of the processes (conditions for the photolithography process, an amount of ion implantation, etching conditions, CMP conditions, design conditions or the like).

The predetermined effect may be improvement in the quality of a product brought by presence of the predetermined process or change of conditions in the predetermined process, which can be numerically identified by the number of products each with the predetermined effect such as the number of acceptable chips or acceptable products, for example.

FIG. 10 is a flow chart illustrating a process analysis method of analyzing the degree of achievement of effect exhibited by the predetermined process in a predetermined manufacturing operation which is applicable to the present invention.

First, in a step S11, a first manufacturing process including a predetermined process is performed on predetermined product materials, to manufacture a first number of products.

Next, in a step S12, a second manufacturing process differing from the first manufacturing process only in details associated with the predetermined process is performed on product materials of the same type as used in the step S11, to manufacture a second number of products of the same kind of the products manufactured by the first manufacturing process.

Then, in a step S13, it is determined whether or not the predetermined effect is achieved with respect to all the products manufactured in the steps S11 and S12.

Thereafter, in a step S14, the products are classified into four categories according to the kind of the process (i.e., which of the first and second manufacturing operations has been performed to manufacture each product) and the presence or absence of the predetermined effect, similarly to the classification shown in FIG. 2.

Finally, in a step S15, the degree of the achievement of the predetermined effect exhibited by the predetermined process is analyzed in the same manner as shown in FIGS. 3–7 and expressed by the equations (1) to (8).

The foregoing process analysis method according to the present invention allows for accurate analysis of the degree of achievement of a predetermined effect exhibited by application of a predetermined process as one of processes included in a manufacturing operation.

<Application to a Computer Program (Computer-implemented Method)>

A program for performing at least a portion of the process analysis method according to the present invention (the steps S14 and S15 in FIG. 10 or the steps S5 and S6 of FIG. 1 in the method of analyzing a cleaning process discussed in the preferred embodiment, for example) may be prepared and executed by a computer. For example, a program stored on a computer readable recording medium may be prepared. As a result, it is possible to automatically perform the process analysis, thereby to significantly reduce labor required therefor.

While the invention has been shown and described in detail, the foregoing description is in all aspects illustrative and not restrictive. It is therefore understood that numerous modifications and variations can be devised without departing from the scope of the invention.

What is claimed is:

1. A computer-implemented method of process analysis comprising the steps of:
   (a) performing a first manufacturing operation including a predetermined process to obtain a first number of products;
   (b) performing a second manufacturing operation differing from said first manufacturing operation only in details associated with said predetermined process to obtain a second number of products of the same kind as those obtained by said step (a);
   (c) determining whether or not a predetermined effect is achieved with respect to each of said products obtained by said steps (a) and (b);
   (d) classifying said products obtained by said steps (a) and (b) into four categories depending on which of said first manufacturing operation and said second manufacturing operation has been performed, and on whether or not said predetermined effect has been achieved; and
   (e) analyzing a degree of achievement of said predetermined effect exhibited by said predetermined process based on classification of said step (d), to provide an analysis result.

2. The computer-implemented method according to claim 1, wherein
   said analysis result includes a process effectiveness rate which is a probability that said predetermined process is assumed to achieve said predetermined effect on said products.

3. The computer-implemented method according to claim 1, wherein
   said analysis result includes an effectiveness increasing number which is a number of said products on which said predetermined effect is assumed to have been achieved only by said predetermined process.

4. The computer-implemented method according to claim 1, wherein
   said analysis result includes representation of a Venn diagram including:
   a first set including said products on which said first manufacturing operation has been performed;
   a second set including said products on which said predetermined effect is assumed to have been achieved by said predetermined process; and
   a third set including said products on which said predetermined effect is assumed to have been achieved by a process other than said predetermined process.

5. The computer-implemented method according to claim 4, wherein
said Venn diagram includes a Venn diagram in which information about said second set is highlighted.

6. The computer-implemented method according to claim 5, wherein
said Venn diagram includes a Venn diagram which shows a number of said products included in said second set.

7. The computer-implemented method according to claim 1, wherein
said predetermined effect includes improvement in quality of each of said products.

8. The computer-implemented method according to claim 7, wherein
said second manufacturing operation includes a manufacturing operation which does not include said predetermined process.

9. The computer-implemented method according to claim 8, wherein
said predetermined process includes a predetermined cleaning process.

10. The computer-implemented method according to claim 9, wherein the predetermined cleaning process includes a predetermined cleaning process on semiconductor wafers.

11. The computer-implemented method according to claim 7, wherein
said second manufacturing operation includes a manufacturing operation including a process which is similar to said predetermined process and differs from said predetermined process in at least a portion thereof.

12. The computer-implemented method according to claim 1, wherein
said products include a semiconductor device, and
said predetermined process includes a predetermined semiconductor processing process.

* * * * *